(12) United States Patent  
Margomenos et al.

(10) Patent No.: US 7,990,237 B2
(45) Date of Patent: Aug. 2, 2011

(54) SYSTEM AND METHOD FOR IMPROVING PERFORMANCE OF COPLANAR WAVEGUIDE BENDS AT MM-WAVE FREQUENCIES

(75) Inventors: Alexandros Margomenos, Ann Arbor, MI (US); Amin Rida, Atlanta, GA (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 232 days.

(21) Appl. No.: 12/355,526

(22) Filed: Jan. 16, 2009

(65) Prior Publication Data

US 2010/0182107 A1    Jul. 22, 2010

(51) Int. Cl.
*H01P 3/08* (2006.01)
(52) U.S. Cl. .......................................... 333/246; 333/34
(58) Field of Classification Search ................. 333/246, 333/33, 34
See application file for complete search history.

(56) References Cited

U.S. PATENT DOCUMENTS

| | | | |
|---|---|---|---|
| 3,093,805 A * | 6/1963 | Osifchin et al. ................. 333/1 |
| 3,686,596 A | 8/1972 | Albee |
| 4,494,083 A | 1/1985 | Josefsson et al. |
| 4,623,894 A | 11/1986 | Lee et al. |
| 4,786,913 A | 11/1988 | Barendregt et al. |
| 5,115,245 A | 5/1992 | Wen et al. |
| 5,124,713 A | 6/1992 | Mayes et al. |
| 5,153,600 A | 10/1992 | Metzler et al. |
| 5,220,335 A | 6/1993 | Huang |
| 5,307,075 A | 4/1994 | Huynh |
| 5,376,902 A | 12/1994 | Bockelman et al. |
| 5,436,453 A | 7/1995 | Chang et al. |
| 5,485,167 A | 1/1996 | Wong et al. |
| 5,495,262 A | 2/1996 | Klebe |
| 5,512,901 A | 4/1996 | Chen et al. |
| 5,554,865 A | 9/1996 | Larson |
| 5,561,405 A | 10/1996 | Hoffmeister et al. |
| 5,583,511 A | 12/1996 | Hulderman |
| 5,633,615 A | 5/1997 | Quan |
| 5,767,009 A | 6/1998 | Yoshida et al. |
| 5,815,112 A | 9/1998 | Sasaki et al. |
| 5,821,625 A | 10/1998 | Yoshida et al. |
| 5,877,726 A | 3/1999 | Kudoh et al. |

(Continued)

FOREIGN PATENT DOCUMENTS

CN          101145627          3/2008

(Continued)

OTHER PUBLICATIONS

"A Shared-Aperture Dual-Band Dual-Polarized Microstrip Array", Pozar, David M. et al., *IEEE Transactions on Antennas and Propagation*, vol. 49, No. 2, pp. 150-157, Feb. 2001.

(Continued)

*Primary Examiner* — Benny Lee
(74) *Attorney, Agent, or Firm* — Snell & Wilmer L.L.P.

(57) ABSTRACT

An apparatus including a liquid crystal polymer substrate having a top surface and a bottom surface, a coplanar waveguide formed on the top surface of the liquid crystal polymer substrate, the coplanar waveguide having a 90 degree bend with a mitered edge, an inner via positioned adjacent to an inner corner of the 90 degree bend, and an outer via positioned adjacent to the mitered edge of the 90 degree bend, the inner and outer vias positioned along a first plane that is perpendicular to a second plane defined by the mitered edge.

19 Claims, 5 Drawing Sheets

U.S. PATENT DOCUMENTS

| | | |
|---|---|---|
| 5,886,671 A | 3/1999 | Riemer et al. |
| 5,929,802 A | 7/1999 | Russell et al. |
| 5,943,005 A | 8/1999 | Tanizaki et al. |
| 5,952,971 A | 9/1999 | Strickland |
| 5,994,766 A | 11/1999 | Shenoy et al. |
| 5,999,092 A | 12/1999 | Smith et al. |
| 6,008,750 A | 12/1999 | Cottle et al. |
| 6,034,641 A | 3/2000 | Kudoh et al. |
| 6,037,911 A | 3/2000 | Brankovic et al. |
| 6,043,772 A | 3/2000 | Voigtlaender et al. |
| 6,091,365 A | 7/2000 | Derneryd et al. |
| 6,107,578 A | 8/2000 | Hashim |
| 6,107,956 A | 8/2000 | Russell et al. |
| 6,114,985 A | 9/2000 | Russell et al. |
| 6,130,640 A | 10/2000 | Uematsu et al. |
| 6,137,434 A | 10/2000 | Tohya et al. |
| 6,191,740 B1 | 2/2001 | Kates et al. |
| 6,232,849 B1 | 5/2001 | Flynn et al. |
| 6,249,242 B1 | 6/2001 | Sekine et al. |
| 6,278,400 B1 | 8/2001 | Cassen et al. |
| 6,281,843 B1 | 8/2001 | Evtioushkine et al. |
| 6,329,649 B1 | 12/2001 | Jack et al. |
| 6,359,588 B1 | 3/2002 | Kuntzsch |
| 6,388,206 B2 | 5/2002 | Dove et al. |
| 6,452,549 B1 | 9/2002 | Lo |
| 6,483,481 B1 | 11/2002 | Sievenpiper et al. |
| 6,483,714 B1 | 11/2002 | Kabumoto et al. |
| 6,501,415 B1 | 12/2002 | Viana et al. |
| 6,577,269 B2 | 6/2003 | Woodington et al. |
| 6,583,753 B1 | 6/2003 | Reed |
| 6,628,230 B2 | 9/2003 | Mikami et al. |
| 6,639,558 B2 | 10/2003 | Kellerman et al. |
| 6,642,819 B1 * | 11/2003 | Jain et al. .................. 333/246 |
| 6,642,908 B2 | 11/2003 | Pleva et al. |
| 6,657,518 B1 | 12/2003 | Weller et al. |
| 6,683,510 B1 | 1/2004 | Padilla |
| 6,686,867 B1 | 2/2004 | Lissel et al. |
| 6,727,853 B2 | 4/2004 | Sasada et al. |
| 6,784,828 B2 | 8/2004 | Delcheccolo et al. |
| 6,794,961 B2 | 9/2004 | Nagaishi et al. |
| 6,795,021 B2 | 9/2004 | Ngai et al. |
| 6,806,831 B2 | 10/2004 | Johansson et al. |
| 6,828,556 B2 | 12/2004 | Pobanz et al. |
| 6,842,140 B2 | 1/2005 | Killen et al. |
| 6,853,329 B2 | 2/2005 | Shinoda et al. |
| 6,864,831 B2 | 3/2005 | Woodington et al. |
| 6,873,250 B2 | 3/2005 | Viana et al. |
| 6,897,819 B2 | 5/2005 | Henderson et al. |
| 6,930,639 B2 | 8/2005 | Bauregger et al. |
| 6,940,547 B1 | 9/2005 | Mine |
| 6,946,995 B2 | 9/2005 | Choi et al. |
| 6,987,307 B2 | 1/2006 | White et al. |
| 6,992,629 B2 | 1/2006 | Kerner et al. |
| 7,009,551 B1 | 3/2006 | Sapletal et al. |
| 7,015,860 B2 | 3/2006 | Alsliety |
| 7,019,697 B2 | 3/2006 | du Toit |
| 7,030,712 B2 | 4/2006 | Brunette et al. |
| 7,034,753 B1 | 4/2006 | Elsallal et al. |
| 7,071,889 B2 | 7/2006 | McKinzie, III et al. |
| 7,081,847 B2 | 7/2006 | Ziller et al. |
| 7,098,842 B2 | 8/2006 | Nakazawa et al. |
| 7,102,571 B2 | 9/2006 | McCarrick |
| 7,106,264 B2 | 9/2006 | Lee et al. |
| 7,109,922 B2 | 9/2006 | Shmuel |
| 7,109,926 B2 | 9/2006 | du Toit |
| 7,142,073 B2 * | 11/2006 | Kim et al. .................. 333/33 |
| 7,154,356 B2 | 12/2006 | Brunette et al. |
| 7,177,549 B2 | 2/2007 | Matsushima et al. |
| 7,187,334 B2 | 3/2007 | Franson et al. |
| 7,193,562 B2 | 3/2007 | Shtrom et al. |
| 7,215,284 B2 | 5/2007 | Collinson |
| 7,236,130 B2 | 6/2007 | Voigtlaender |
| 7,239,779 B2 | 7/2007 | Little |
| 7,268,732 B2 | 9/2007 | Gotzig et al. |
| 7,292,125 B2 | 11/2007 | Mansour et al. |
| 7,298,234 B2 * | 11/2007 | Dutta .................. 333/246 |
| 7,307,581 B2 | 12/2007 | Sasada |
| 7,331,723 B2 | 2/2008 | Yoon et al. |
| 7,336,221 B2 | 2/2008 | Matsuo et al. |
| 7,355,547 B2 | 4/2008 | Nakazawa et al. |
| 7,358,497 B1 | 4/2008 | Boreman et al. |
| 7,362,259 B2 | 4/2008 | Gottwald |
| 7,388,279 B2 | 6/2008 | Fjelstad et al. |
| 7,411,542 B2 | 8/2008 | O'Boyle |
| 7,414,569 B2 | 8/2008 | De Mersseman |
| 7,436,363 B1 | 10/2008 | Klein et al. |
| 7,446,696 B2 | 11/2008 | Kondo et al. |
| 7,456,790 B2 | 11/2008 | Isono et al. |
| 7,463,122 B2 | 12/2008 | Kushta et al. |
| 7,489,280 B2 | 2/2009 | Aminzadeh et al. |
| 7,528,780 B2 | 5/2009 | Thiam et al. |
| 7,603,097 B2 | 10/2009 | Leblanc et al. |
| 2002/0047802 A1 | 4/2002 | Voipio |
| 2002/0158305 A1 | 10/2002 | Dalmia et al. |
| 2003/0016162 A1 | 1/2003 | Sasada et al. |
| 2003/0034916 A1 | 2/2003 | Kwon et al. |
| 2003/0036349 A1 | 2/2003 | Liu et al. |
| 2004/0028888 A1 | 2/2004 | Lee et al. |
| 2004/0075604 A1 | 4/2004 | Nakazawa et al. |
| 2005/0109453 A1 | 5/2005 | Jacobson et al. |
| 2005/0248418 A1 | 11/2005 | Govind et al. |
| 2006/0044189 A1 | 3/2006 | Livingston et al. |
| 2006/0152406 A1 | 7/2006 | Leblanc et al. |
| 2006/0158378 A1 | 7/2006 | Pons et al. |
| 2006/0250298 A1 | 11/2006 | Nakazawa et al. |
| 2006/0267830 A1 | 11/2006 | O'Boyle |
| 2006/0290564 A1 | 12/2006 | Sasada et al. |
| 2007/0026567 A1 | 2/2007 | Beer et al. |
| 2007/0085108 A1 | 4/2007 | White et al. |
| 2007/0131452 A1 | 6/2007 | Gilliland |
| 2007/0230149 A1 | 10/2007 | Bibee |
| 2007/0279287 A1 | 12/2007 | Castaneda et al. |
| 2007/0285314 A1 | 12/2007 | Mortazawi et al. |
| 2008/0030416 A1 | 2/2008 | Lee et al. |
| 2008/0048800 A1 | 2/2008 | Dutta |
| 2008/0068270 A1 | 3/2008 | Thiam et al. |
| 2008/0074338 A1 | 3/2008 | Vacanti |
| 2008/0150821 A1 | 6/2008 | Koch et al. |
| 2008/0169992 A1 | 7/2008 | Ortiz et al. |
| 2009/0058731 A1 | 3/2009 | Geary et al. |
| 2009/0066593 A1 | 3/2009 | Jared et al. |
| 2009/0102723 A1 | 4/2009 | Mateychuk et al. |
| 2009/0251356 A1 | 10/2009 | Margomenos |
| 2009/0251362 A1 | 10/2009 | Margomenos et al. |

FOREIGN PATENT DOCUMENTS

| | | |
|---|---|---|
| EP | 1324423 | 7/2003 |
| KR | 777967 | 11/2007 |
| WO | WO 2007/149746 | 12/2007 |
| WO | WO 2008148569 | 12/2008 |

OTHER PUBLICATIONS

"Design and Characterization of the EBG Waveguide-Based Interconnects"; Asanee Suntives et al.; *IEEE Transactions on Advanced Packaging*, vol. 30, No. 2; pp. 163-170; May 2007.

"Simulation and Performance of Passive Millimeter Wave Coplanar Waveguide Circuit Devices"; S.D. Gedney et al.; *1997 Wireless Communications Conference*; pp. 27-31; May 1997.

"Three-Dimensional High-Frequency Distribution Networks—Part I: Optimization of CPW Discontinuities"; Thomas M. Weller; *IEEE Transactions on Microwave Theory and Techniques*, vol. 48, No. 10; pp. 1635-1642; Oct. 2000.

"Effects of Air-Bridges and Mitering on Coplanar Waveguide 90° Bends: Theory and Experiment"; A.A. Omar et al.; *1993 IEEE MTT-S Digest*; pp. 823-826; 1993.

"Design and Optimization of CPW Circuits Using EM-ANN Models for CPW Components"; Paul M. Watson et al.; *IEEE Transactions on Microwave Theory and Techniques*, vol. 45, No. 12; pp. 2515-2523; Dec. 1997.

"Application of a Substrate-Lens Antenna Concept and SiGe Component Development for Cost-Efficient Automotive Radar", Denis Chouvaev et al., *Swedish National Testing and Research Institute, 34th European Microwave Conference*, Amsterdam, 2004, pp. 1417-1420.

"Combined Feed Network for a Shared-Aperture Dual-Band Dual-Polarized Array", Vetharatnam et al., *IEEE Antennas and Wireless Propagation Letters*, vol. 4., pp. 297-299, 2005.

"Coupling Suppression in Microstrip Lines using a Bi-Periodically Perforated Ground Plane", *IEEE Microwave and Wireless Components Letters*, vol. 12, No. 5, pp. 169-171, May 2002.

U.S. Appl. No. 12/098,283, filed Apr. 4, 2008, Margomenos et al.

K. Schuler et al., Innovative Material Modulation for Multilayer LTCC Antenna at 76.5 GHz in Radar and Communication Applications; Proceedings of the 33$^{rd}$ European Microwave Conference, Munich Germany 2003; pp. 707-710; printed in the year 2003.

H. Iizuka et al., "Millimeter-Wave Microstrip Array Antenna for Automotive Radars, IEICE Transactions for Communications", vol. E86-B, No. 9, pp. 2728-2738, Sep. 2003.

U.S. Appl. No. 12/340,448, filed Dec. 19, 2008, Margomenos.

Margomenos et al., "Isolation in Three-Dimensional Integrated Circuits", *IEEE Transactions on Microwave Theory and Techniques*, vol. 51, issue 1, pp. 25-32, Jan. 2003.

Ponchak et al., "Characterization of the Coupling Between Adjacent Finite Ground Coplanar (FGC) waveguides", *Int. J. Microcircuits Electron. Packag.*, vol. 20, No. 4, pp. 587-592, Nov. 1997.

Ponchak et al., "Coupling Between Microstrip Lines With Finite Width Ground Plane Embedded in Thin-Film Circuits", *IEEE Transactions on Advanced Packaging*, vol. 28, No. 2, pp. 320-327, May 2005.

Ponchak et al., "The Use of Metal Filled Via Holes for Improving Isolation in LTCC RF and Wireless Multichip Packages", *IEEE Transactions on Advanced Packaging*, vol. 23, No. 1, pp. 88-99, Feb. 2000.

Papapolymerou et al., "Crosstalk Between Finite Ground Coplanar Waveguides Over Polyimide Layers for 3-D MMICs on Si Substrates", IEEE Transactions on Microwave Theory and Techniques, vol. 52, No. 4, pp. 1292-1301, Apr. 2004.

Mbairi et al., "On the Problem of Using Guard Traces for High Frequency Differential Lines Crosstalk Reduction", *IEEE Transactions on Components and Packaging Technologies*, vol. 30, No. 1, pp. 67-74, Mar. 2007.

* cited by examiner

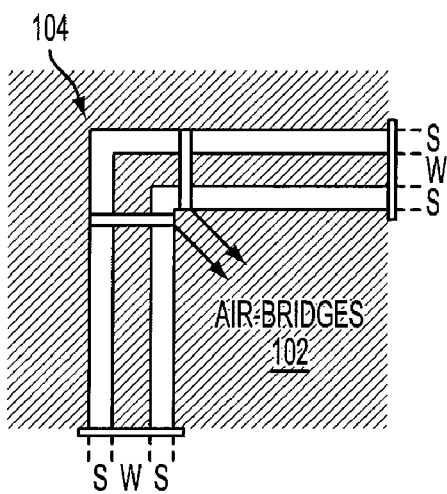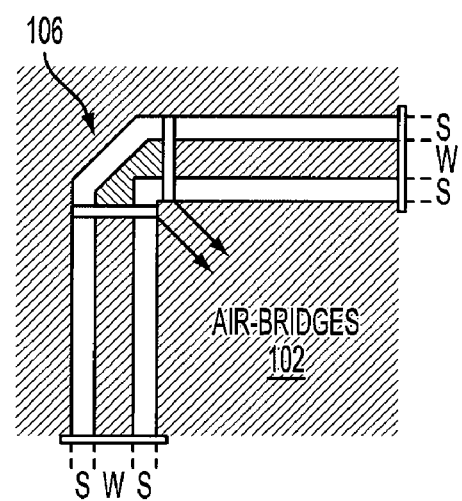
FIG. 1A
PRIOR ART
FIG. 1B
PRIOR ART

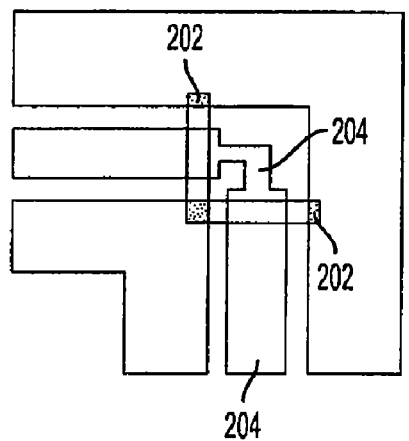
FIG. 2
PRIOR ART
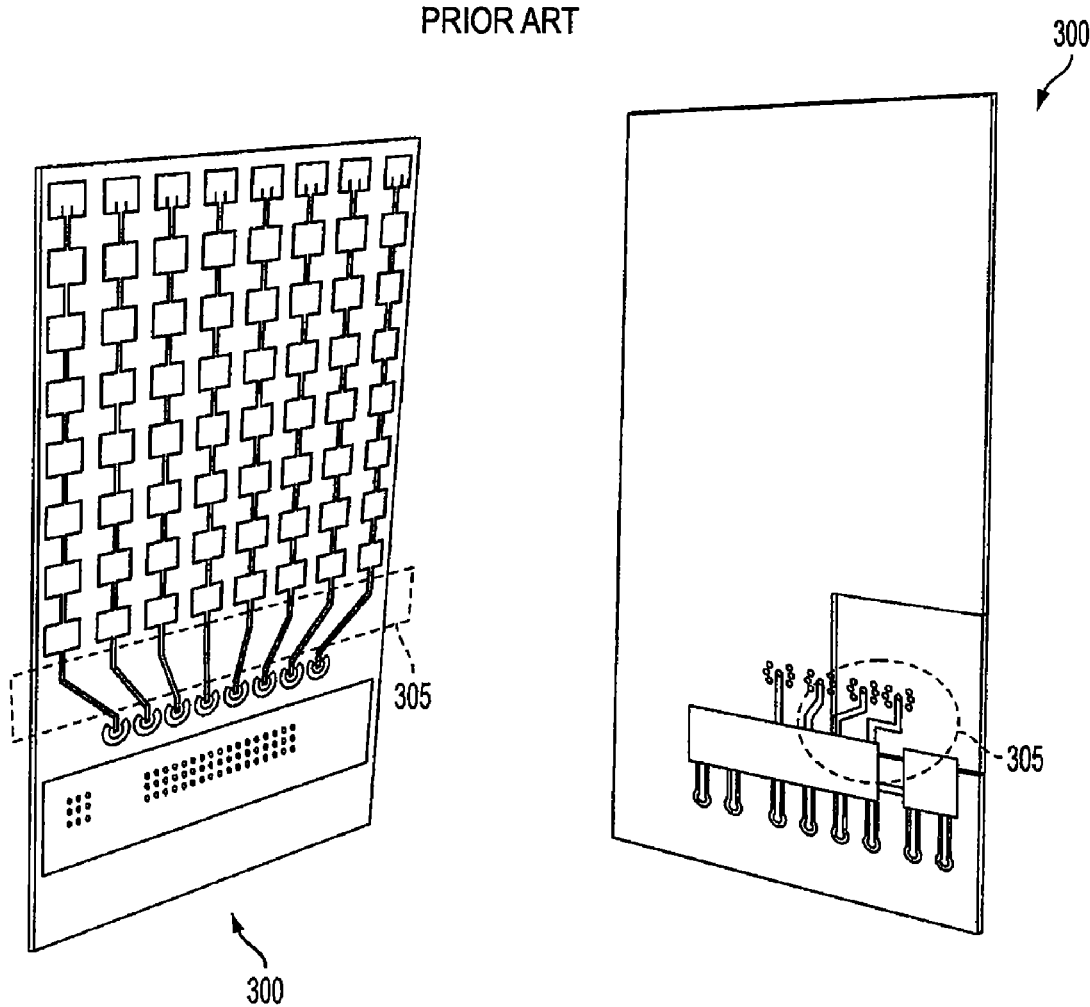
FIG. 3
PRIOR ART
FIG. 4
PRIOR ART

SYSTEM AND METHOD FOR IMPROVING PERFORMANCE OF COPLANAR WAVEGUIDE BENDS AT MM-WAVE FREQUENCIES

BACKGROUND

1. Field

The invention relates to systems and methods for improving the performance of 90 degree coplanar waveguide (CPW) bends at mm-wave frequencies. More particularly, the CPW bends may be chamfered on the signal conductor and the ground plane and additional vias may be placed near the CPW bends.

2. Background

Microwave and mm-wave RF circuits may be integrated on a dielectric substrate with transmission lines (e.g., CPW) that feed the RF signals between the circuits. Such transmission lines often include bends that turn the direction of energy propagation (i.e., change the direction of field orientation) from one direction to another. A right angle transmission line bend, for example, turns the direction of energy propagation around 90 degrees. One drawback is that transmission line bends introduce losses.

One type of loss, called a return loss, relates to the energy that is reflected back from the transmission line bend. Return losses can be created due to capacitance and inductance being formed around the transmission line bends. For example, capacitance may arise through charge accumulation at the right angle transmission line bend, particularly, around the outer point of the transmission line bend where the electric fields concentrate. Inductance may arise due to current flow constriction. In addition, the change of field orientation at the right angle transmission line bend is influenced by mode conversions. These influences significantly increase the return loss.

Focusing on the return loss, several techniques have been implemented in the past to compensate for the transmission line bends in order to reduce the effect of the capacitance and inductance. For example, the transmission line bends may be mitered and rounded where the miter technique removes metal where there is no current flow, and that reduces the capacitance and inductance. Doing so improves the voltage standing wave ratio (VSWR) and reduces the return loss.

A coplanar waveguide (CPW) is an attractive choice for the development of monolithic microwave integrated circuits (MMICs). A CPW is formed from a conductor separated from a pair of ground planes, all on the same plane, atop a dielectric medium. Several advantages of CPWs include ease of shunt and series connections, low radiation, low dispersion, and avoidance of the need for thin fragile substrates. One drawback of a prior art CPW bend is that the two slots and the two ground planes on each side of the center conductor have different lengths. The different lengths cause unwanted slot-line and parallel plate modes which tend to radiate and reduce the overall performance of the transmission line.

FIG. 1A is a schematic view of a prior art CPW bend 104 that utilizes air-bridges 102 for performance improvements. FIG. 1B is a schematic view of a prior art chamfered CPW bend 106 that utilizes air-bridges 102 for performance improvements. The prior art CPW may include a center signal plane and a pair of ground planes. The center signal plane may have a width W, and it may be spaced between the pair of ground planes with a slot width S. Referring to FIGS. 1A and 1B, the placement of air-bridges 102 near the CPW bends 104 and 106 has been used to eliminate unwanted slot-line and parallel plate modes. However, the inclusion of air-bridges 102 may add unwanted capacitance on the transmission lines which can further degrade the CPW performance. CPW performance is especially important at mm-wave frequencies.

FIG. 2 is a schematic view of a prior art CPW bend that utilizes high-impedance transmission line sections 204 under the air-bridges 202 for performance improvements. The high-impedance transmission line sections 204 under the air-bridges 202 are narrower and therefore add less parasitic capacitance on the transmission line. However, the high-impedance transmission line sections 204 require the addition of short matching networks.

Although the foregoing techniques are helpful in reducing the return loss for the transmission line bends, additional improvements can be made to improve the VSWR and reduce the return loss. Moreover, they require the fabrication of air-bridges which is complex. Therefore, a need exists in the art for systems and methods for improving the performance of CPW bends at mm-wave frequencies without the need for air-bridges.

SUMMARY OF THE INVENTION

An apparatus including a liquid crystal polymer substrate having a top surface and a bottom surface, a coplanar waveguide formed on the top surface of the liquid crystal polymer substrate, the coplanar waveguide having a 90 degree bend with a mitered edge, an inner via positioned adjacent to an inner corner of the 90 degree bend, and an outer via positioned adjacent to the mitered edge of the 90 degree bend, the inner and outer vias positioned along a first plane that is perpendicular to a second plane defined by the mitered edge.

BRIEF DESCRIPTION OF THE DRAWINGS

The features, objects, and advantages of the invention will become more apparent from the detailed description set forth below when taken in conjunction with the drawings, wherein:

FIG. 1A is a schematic view of a prior art CPW bend that utilizes air-bridges for performance improvements;

FIG. 1B is a schematic view of a prior art chamfered CPW bend that utilizes air-bridges for performance improvements;

FIG. 2 is a schematic view of a prior art CPW bend that utilizes high-impedance transmission line sections under the air-bridges for performance improvements;

FIG. 3 is a schematic top view of a three-dimensional automotive radar RF front-end according to an embodiment of the invention;

FIG. 4 is a schematic bottom view of the three-dimensional automotive radar RF front-end according to an embodiment of the invention;

DETAILED DESCRIPTION OF THE INVENTION

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements and may not be described in detail for all drawing figures in which they appear.

FIG. 3 is a schematic top view of a three-dimensional automotive radar RF front-end 300 having a plurality of CPW bends 305 according to an embodiment of the invention. FIG. 4 is a schematic bottom view of the three-dimensional automotive radar RF front-end 300 having a plurality of CPW bends 305 according to an embodiment of the invention. The plurality of CPW bends 305 achieve optimum performance by exploiting the capabilities provided by the use of a liquid crystal polymer (LCP) substrate. The plurality of CPW bends 305 are wideband (e.g., 60-90 GHz) to increase fabrication and assembly tolerances and have low-insertion loss (e.g., less than −1 dB) to reduce the loss between the antenna and the T/R module. The loss generally dominates the overall noise figure of the radar and eventually limits its sensitivity and read range. The low return loss, small size to allow for the co-location of multiple transitions in close proximity to the chip, low cost, and minimum number of vias are compatible with LCP design rules.

The automotive radar RF front-end 300 achieves very good RF performance (i.e. low insertion and return loss and wide bandwidth) by utilizing a chamfered or mitered bend on the signal conductor and the ground plane and by strategically placing vias adjacent to the CPW bends 305. The automotive radar RF front-end 300 may be implemented using hardware, software, firmware, middleware, microcode, or any combination thereof. One or more elements can be rearranged and/or combined, and other radars can be used in place of the radar RF front-end 300 while still maintaining the spirit and scope of the invention. Elements may be added to the radar RF front-end 300 and removed from the radar RF front-end 300 while still maintaining the spirit and scope of the invention.

Figure 5:
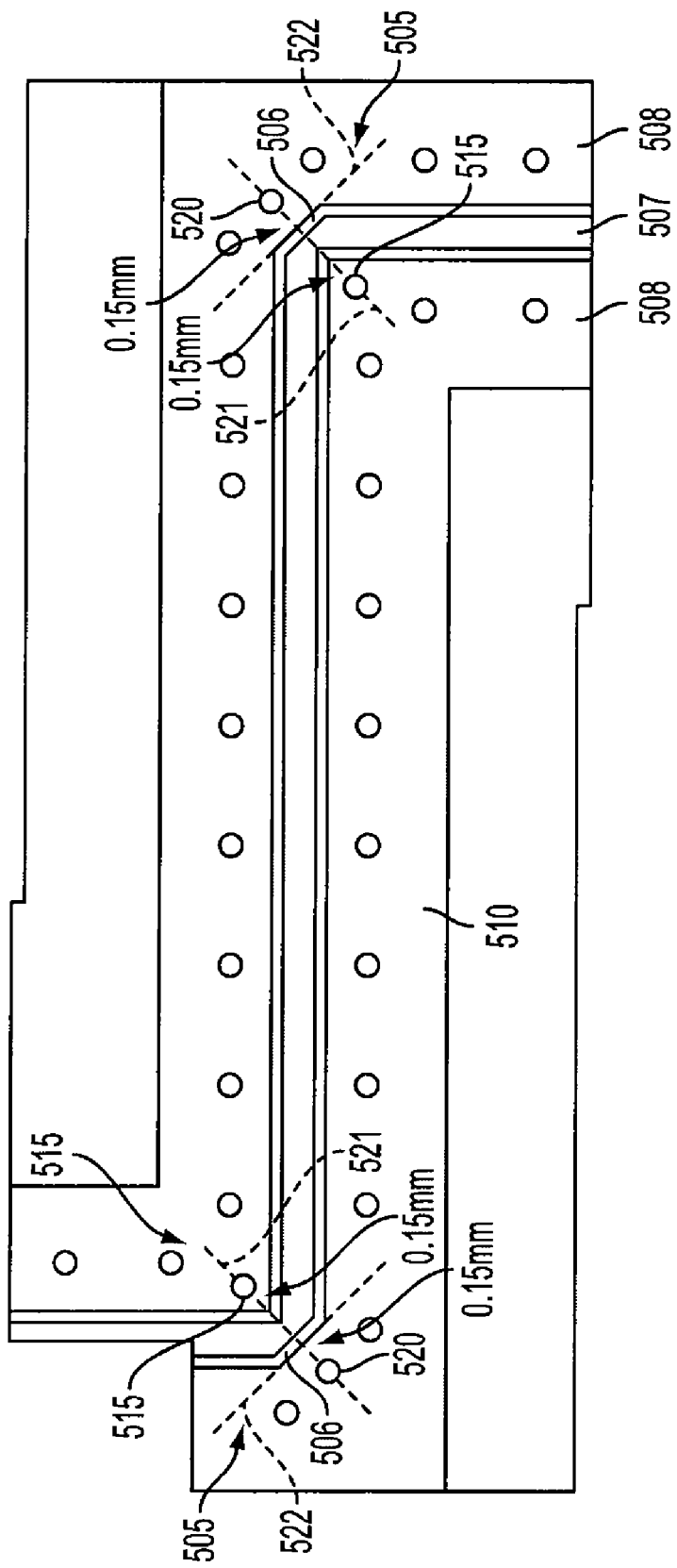
FIG. 5 is a schematic diagram showing a back-to-back 90 degree CPW bends on a liquid crystal polymer (LCP) according to an embodiment of the invention.

FIG. 5 is a schematic diagram showing a back-to-back 90 degree CPW bends 505 on a LCP 510 according to an embodiment of the invention. The CPW bends 505 may be used with automotive radar and passive mm-wave imager applications. Each CPW bend 505 has a mitered corner 506. In one embodiment, signal plane 507 and ground planes 508 are chamfered. The CPW bends 505 are formed on a LCP 510 or any other low-cost organic substrate. The CPW bends 505 are made of a metallic material and are used to propagate signals.

Figure 6:
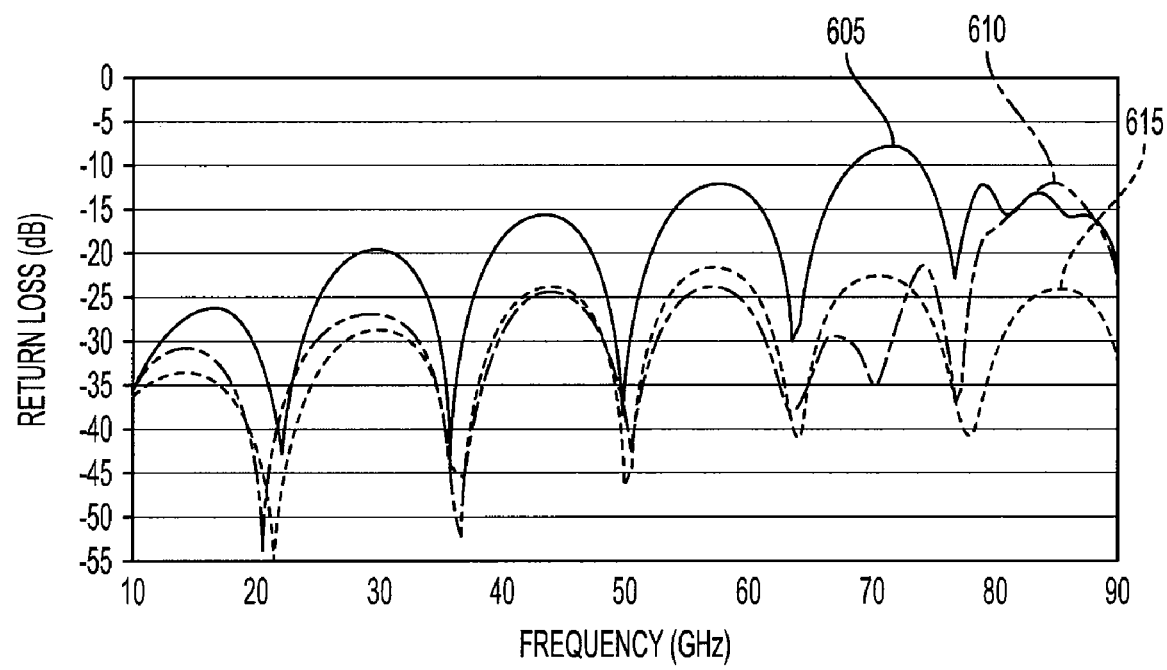
FIG. 6 is a graph of return loss (dB) versus frequency (GHz) for the apparatus shown in FIG. 5 according to an embodiment of the invention.
Figure 7:
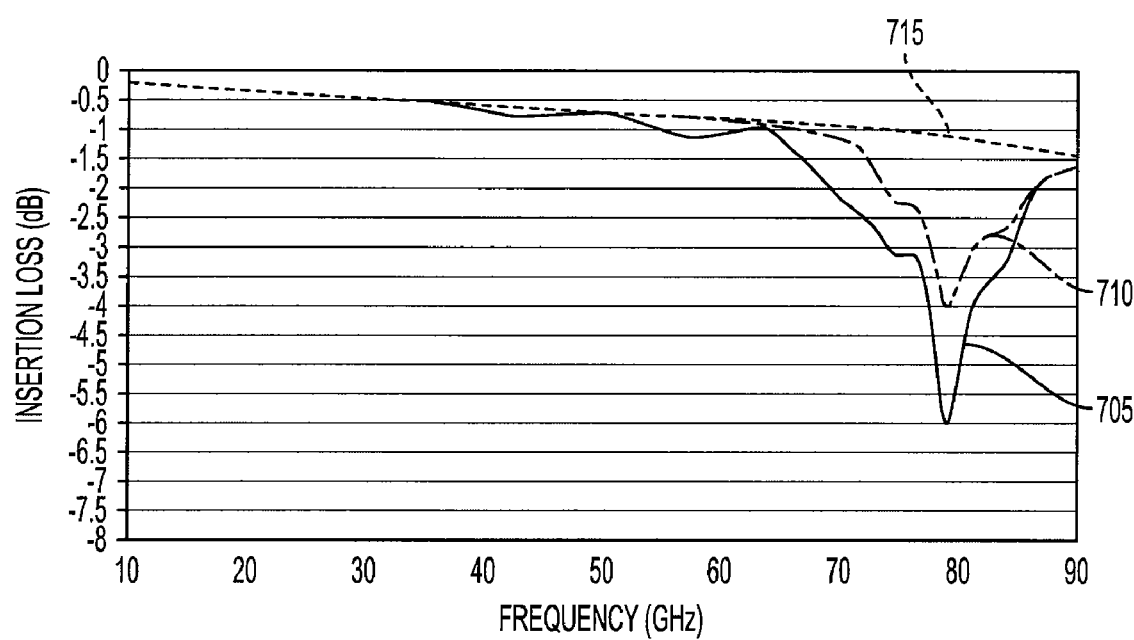
FIG. 7 is a graph of insertion loss (dB) versus frequency (GHz) for the apparatus shown in FIG. 5 according to an embodiment of the invention.

An inner via 515 and an outer via 520 are positioned adjacent to each CPW bend 505. The inner via 515 and the outer via 520 are preferably metalized vias. The inner via 515 and the outer via 520 lie along a first plane 521 that is perpendicular to a second plane 522 defined by the CPW bend 505. The inner via 515 and the outer via 520 enhance and optimize the performance of the CPW bend 505. The enhancement and optimization of performance is shown in FIGS. 6 and 7. That is, the return and insertion losses are reduced from 605, 705 (no chamfering and no vias) to 610, 710 (chamfering and no vias) to 615, 715 (chamfering and vias). In one embodiment, as depicted in FIG. 5, the inner via 515 is about 0.15 millimeters in diameter, about 0.1 millimeters in depth, and positioned about 0.15 millimeters away from the CPW bend 505. Similarly, the outer via 520 is about 0.15 millimeters in diameter, about 0.1 millimeters in depth, and positioned about 0.15 millimeters away from the CPW bend 505. The inner via 515 and the outer via 520 are used to suppress the parasitic parallel plate and slot-line modes. The inner and outer vias 515 and 520 are created with either laser or mechanical drilling and are filled with metal.

FIG. 6 is a graph of return loss (dB) versus frequency (GHz) for the apparatus shown in FIG. 5 according to an embodiment of the invention. Curve 605 shows the return loss of a bend with a sharp corner, curve 610 shows the return loss of a bend with a chamfered end, and curve 615 shows the return loss of a bend with a chamfered end and inner and outer vias 515 and 520 of FIG. 5. The bend with a sharp corner (curve 605) can be used for frequencies up to 60 GHz, the bend with a chamfered end (curve 610) can be used for frequencies up to 75 GHz, and the bend with a chamfered end and inner and outer vias 515 and 520 of FIG. 5 (curve 615) can be used for frequencies up to 90 GHz and even higher. Hence, the performance (i.e., return loss) of the bend with a chamfered end and inner and outer vias 515 and 520 of FIG. 5 is better than other bends without the inner and outer vias 515 and 520 of FIG. 5.

FIG. 7 is a graph of insertion loss (dB) versus frequency (GHz) for the apparatus shown in FIG. 5 according to an embodiment of the invention. Curve 705 shows the insertion loss of a bend with a sharp corner, curve 710 shows the insertion loss of a bend with a chamfered end, and curve 715 shows the insertion loss of a bend with a chamfered end and inner and outer vias 515 and 520 of FIG. 5. The bend with a sharp corner (curve 705) can be used for frequencies up to 60 GHz, the bend with a chamfered end (curve 710) can be used for frequencies up to 75 GHz, and the bend with a chamfered end and inner and outer vias 515 and 520 of FIG. 5 (curve 715) can be used for frequencies up to 90 GHz and even higher. Hence, the performance (i.e., insertion loss) of the bend with a chamfered end and inner and outer vias 515 and 520 of FIG. 5 is better than other bends without the inner and outer vias 515 and 520 of FIG. 5.

Those of ordinary skill would appreciate that the various illustrative logical blocks, modules, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:
1. An apparatus comprising:
a substrate having a top surface and a bottom surface;
a waveguide disposed on the top surface of the substrate, the waveguide having a pair of coplanar ground planes and a signal plane positioned between the pair of coplanar ground planes, the pair of coplanar ground planes co-extending with the signal plane, the waveguide defining a 90 degree bend with an inner edge and a chamfered outer edge; and an inner via being positioned in one of the pair of coplanar ground planes adjacent to the inner edge of the 90 degree bend.

2. The apparatus of claim 1 wherein the substrate is a liquid crystal polymer substrate.

3. The apparatus of claim 1 wherein the inner via is positioned about 0.15 millimeters away from the inner edge.

4. The apparatus of claim 1 further comprising an outer via positioned in the other one of the pair of coplanar ground planes adjacent to the chamfered outer edge of the 90 degree bend.

5. The apparatus of claim 4 wherein the inner edge, the chamfered outer edge, the inner via and the outer via are all positioned along a first plane.

6. The apparatus of claim 4 wherein the inner and outer vias are positioned along a first plane that is perpendicular to a second plane defined by the chamfered outer edge.

7. The apparatus of claim 4 wherein the outer via is positioned about 0.15 millimeters away from the chamfered outer edge.

8. The apparatus of claim 4 wherein the inner and outer vias are filled with a metal material.

9. The apparatus of claim 4 wherein the inner and outer vias each have a diameter of about 0.15 millimeters.

10. An apparatus comprising:
a liquid crystal polymer substrate having a top surface and a bottom surface;
a coplanar waveguide disposed on the top surface of the liquid crystal polymer substrate, the coplanar waveguide having a pair of coplanar ground planes and a signal plane positioned between the pair of coplanar ground planes, the pair of coplanar ground planes co-extending with the signal plane, the coplanar waveguide defining a 90 degree bend with a mitered edge;
an inner via positioned in one of the pair of coplanar ground planes adjacent to an inner corner of the 90 degree bend; and
an outer via positioned in the other one of the pair of coplanar ground planes adjacent to the mitered edge of the 90 degree bend, the inner and outer vias being positioned along a first plane that is perpendicular to a second plane defined by the mitered edge.

11. The apparatus of claim 10 wherein the inner corner, the mitered edge, the inner via and the outer via are all positioned along a first plane.

12. The apparatus of claim 10 wherein the inner via is positioned about 0.15 millimeters away from the inner corner.

13. The apparatus of claim 10 wherein the outer via is positioned about 0.15 millimeters away from the mitered edge.

14. The apparatus of claim 10 wherein the inner and outer vias are filled with a metal material.

15. The apparatus of claim 10 wherein the inner and outer vias each have a diameter of about 0.15 millimeters.

16. An apparatus comprising:
a liquid crystal polymer substrate having a top surface and a bottom surface;
a coplanar waveguide disposed on the top surface of the liquid crystal polymer substrate, the coplanar waveguide having a pair of coplanar ground planes and a signal plane positioned between the pair of coplanar ground planes, the pair of coplanar ground planes co-extending with the signal plane, the coplanar waveguide defining a 90 degree bend with an inner edge and a chamfered outer edge;
an inner via positioned in one of the pair of coplanar ground planes adjacent to the inner edge of the 90 degree bend; and
an outer via positioned in the other one of the pair of coplanar ground planes adjacent to the chamfered outer edge of the 90 degree bend, the inner and outer vias being positioned along a first plane that is perpendicular to a second plane defined by the chamfered outer edge.

17. The apparatus of claim 16 wherein the inner edge, the chamfered outer edge, the inner via and the outer via are all positioned along a first plane.

18. The apparatus of claim 16 wherein the inner via is positioned about 0.15 millimeters away from the inner edge.

19. The apparatus of claim 16 wherein the outer via is positioned about 0.15 millimeters away from the chamfered outer edge.

* * * * *